United States Patent [19]

Silva

[11] 3,725,680

[45] Apr. 3, 1973

[54] APPARATUS FOR DIGITIZING NOISY TIME DURATION SIGNALS WHICH PREVENTS ADVERSE EFFECTS OF CONTACT BOUNCE

[75] Inventor: John R. Silva, Rehoboth, Mass.

[73] Assignee: General Signal Corporation, New York, N.Y.

[22] Filed: Jan. 3, 1972

[21] Appl. No.: 214,934

[52] U.S. Cl. ....................307/268, 307/215, 307/232, 307/247 A, 307/273, 328/207, 340/365 E

[51] Int. Cl. .....H03k 5/153, H03k 3/10, H03k 3/284

[58] Field of Search..307/214, 215, 232, 236, 247 R, 307/247 A, 261, 268, 269, 273; 328/63, 110, 128, 162, 165, 201, 207; 340/365 E

[56] References Cited

UNITED STATES PATENTS

| | | | |
|---|---|---|---|
| 2,723,346 | 11/1955 | Magnuson | 307/247 A X |
| 3,217,179 | 11/1965 | Okuda et al. | 307/247 A |
| 3,333,111 | 7/1967 | Houle | 307/247 A X |
| 3,508,079 | 4/1970 | Moll et al. | 307/247 A |
| 3,544,983 | 12/1970 | Wallace, Jr. et al. | 307/235 X |
| 3,569,743 | 3/1971 | Baessler | 307/273 |
| 3,571,732 | 3/1971 | Richardson | 307/273 X |
| 3,577,014 | 4/1971 | Low | 307/273 |
| 3,624,518 | 11/1971 | Dildy, Jr. | 307/247 A X |
| 3,660,826 | 5/1972 | Lins | 340/365 E X |
| 3,668,432 | 6/1972 | Rhodes | 307/215 X |

FOREIGN PATENTS OR APPLICATIONS

| | | | |
|---|---|---|---|
| 1,935,156 | 2/1970 | Germany | 307/247 A |

OTHER PUBLICATIONS

Getzlaff et al., "Circuit to Eliminate Contact Bounce and Reject Noise," IBM Tech. Discl. Bull. Vol. 12, No. 6, p. 858–859, 11/1969

Petersen, "Contact Bounce Integrator," IBM Tech. Dis. Bull. Vol. 13, No. 8, p. 2188, 1/1971.

Fisher et al., "Variable Method for Elimination of Key Bounce," IBM Tech. Disc. Bull.; Vol. 13, No. 11, p. 3303–3304; 4/1971.

*Primary Examiner*—Herman Karl Saalbach
*Assistant Examiner*—L. N. Anagnos
*Attorney*—Austin P. Dodge et al.

[57] ABSTRACT

The disclosure concerns apparatus for preventing contact bounce noise in time duration signals from triggering the production of the control pulses needed to transduce those signals into digital form. It also concerns a special gated one-shot multivibrator for that apparatus which consists of two NOT-type logic gates and passive resistance and capacitance elements.

4 Claims, 8 Drawing Figures

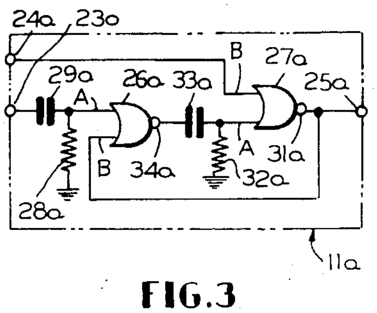
FIG.3
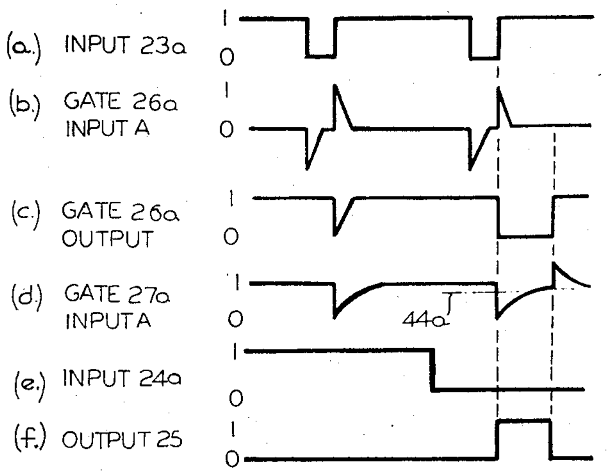
FIG.4
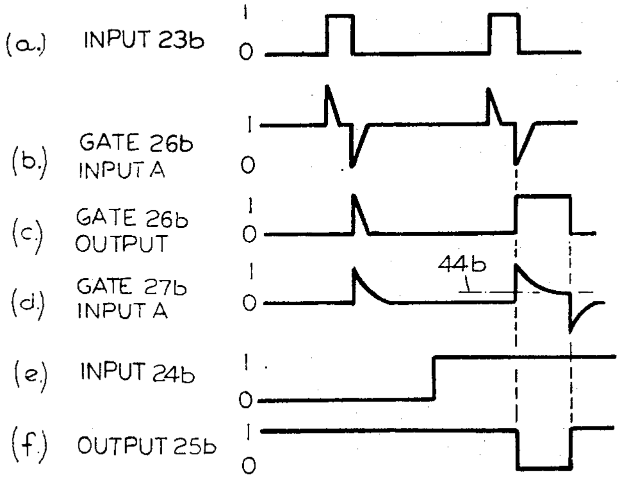
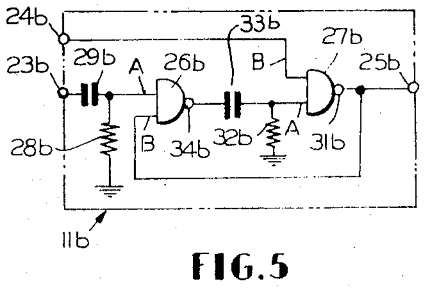
FIG.5
FIG.6
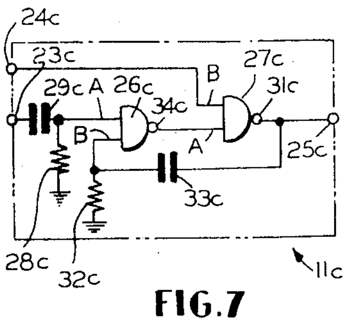
FIG.7
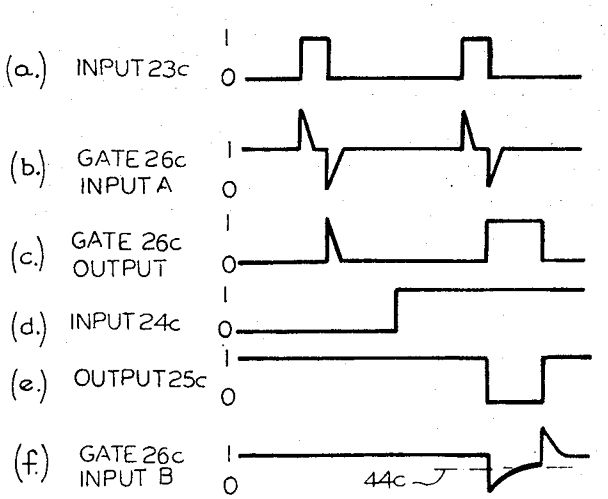
FIG.8

APPARATUS FOR DIGITIZING NOISY TIME DURATION SIGNALS WHICH PREVENTS ADVERSE EFFECTS OF CONTACT BOUNCE

BACKGROUND AND SUMMARY OF THE INVENTION

The copending application of Quentin C. Turtle, Ser. No. 196,033, filed Nov. 5, 1971, discloses apparatus for converting noisy time duration signals into digital form which includes a masking circuit for preventing the noise components of the signals from triggering the production of the control pulses which are required for the analog-to-digital conversion process. The noise is attributable to bounce of switch contacts which open and close at the ends of each signal, and the masking circuit includes a one-shot multivibrator which produces an output pulse having a longer duration than the bounce period the first time signal voltage reverts to its reference level following either the leading or the trailing edge of the signal. The output pulse is coupled to the input of a second conventional one-shot multivibrator, which serves as the control pulse generator, by a network comprising a differentiator, and a blocking diode which controls current flow between that input and the source of the time duration signals. The arrangement is such that the diode conducts and prevents development of the voltage pulse required to trigger the second one-shot except when the time duration signal is at its reference level. Therefore, the scheme guarantees that production of the control pulse is synchronized to the trailing end of the signal and does not result from any of the fluctuations in the signal voltage which occur during a bounce period.

Although the masking circuit just mentioned can be used successfully in specific applications, it has an undesirable characteristic which precludes it from being accepted as a general solution to the noise problem by designers of production equipment. I am referring here to the fact that the trigger pulse-inhibiting action of the diode depends upon its forward resistance, which varies between certain limits determined by manufacturing tolerances. In cases where design considerations require that the second one-shot be triggered by a relatively small voltage pulse, it can happen that the forward resistance of certain diodes in a large commercial order will be such that those particular diodes will be incapable of performing the desired inhibiting function. This risk can be eliminated by a careful selection of the diodes used in production circuits, but that procedure is burdensome and expensive.

It is an object of this invention to provide an economical way of improving the reliability of the masking circuit of the Turtle application. According to this invention, the control pulse generator is defined by a gated one-shot multivibrator whose output is conditioned by the voltage at two, independent inputs. One input is coupled to the output of the masking one-shot multivibrator, and the other is coupled to the source of the time duration signals, and the control pulse is produced only when the signal voltage is at its reference level at the time the trailing edge of the output pulse of the masking one-shot is received. This arrangement insures synchronism between the control pulse and the trailing edge of the time duration signal without requiring specially selected components.

In accordance with the preferred teachings of the invention, the gated one-shot just mentioned is of a special design. Basically, this component comprises only two active elements, namely, a pair of NOT-type logic gates, and a pair of passive resistance and capacitance elements which are connected to define a differentiating network. Each gate has two separate inputs, one of which is coupled to the output of the other gate, and the other of which receives either triggering pulses or a gating voltage. The differentiating network is incorporated in one of the output-input couplings, and its time constant determines the width of the final output or control pulse, which is taken from the gate to which the gating voltage is applied. If the one-shot circuit uses NOR gates, the final output pulse is positive and is produced only upon receipt of positive-going trigger pulse and a gating voltage having a 0 logic value. On the other hand, if the circuit uses NAND gates, the output is a negative-going pulse, and it is developed by a negative-going trigger pulse and a gating voltage having a 1 logic level. Inasmuch as the special circuit implements the gated or conditional one-shot function using the same number of active and passive elements as the conventional logic gate type of one-shot multivibrator, it is uniquely economical as far as circuit hardware is concerned.

BRIEF DESCRIPTION OF THE DRAWINGS

Several embodiments of the invention are described herein with reference to the accompanying drawings in which:

FIG. 3 is a schematic diagram of an alternative form of the special gated one-shot multivibrator employing NOR gates.

FIG. 4 is a graph showing the wave forms for the FIG. 3 apparatus.

FIG. 5 is a schematic diagram of a gated one-shot utilizing NAND gates.

FIG. 6 is a graph showing the wave forms for the FIG. 5 apparatus.

FIG. 7 is a schematic diagram of an alternative gated one-shot utilizing NAND gates.

FIG. 8 is a graph showing the wave forms for the FIG. 7 apparatus.

DETAILED DESCRIPTION OF ILLUSTRATED EMBODIMENTS

Figure 1:
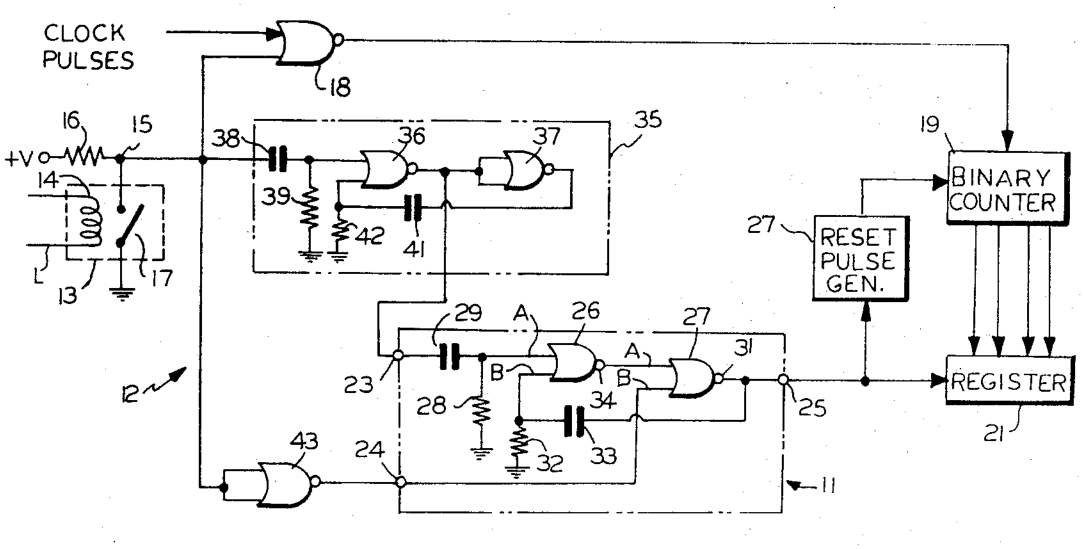
FIG. 1 is a simplified schematic diagram showing one form of the special gated one-shot multivibrator embodied in the masking scheme of the patent application mentioned above.

As shown in FIG. 1, the special gated one-shot multivibrator 11 is incorporated in a telemetric receiver 12 having a line isolation relay 13 whose coil 14 is connected with the conductors of a transmission line L leading from a transmitter (not shown). Relay 13 has an output connection 15 which is joined to a source of DC voltage through an isolation resistor 16, and which is selectively connected with a source of more negative voltage, indicated by a ground symbol, through the normally open relay contact 17. Relay 13 is energized by the transmitted time duration signal, so the voltage at connection 15 will be at the lower level for the duration of each such signal, and will be at the higher level during the interval between signals. For convenience, these levels will be referred to hereafter by their binary logic equivalents of 0 and 1.

The time duration signals at connection 15 are supplied to one input of a NOR gate 18 where they serve to control entry of clock pulses into a binary counter 19. The clock pulses are referenced to the same 0 and 1 voltage scale as the voltage at connection 15, so delivery of clock pulses to counter 19 occurs only during the time that a transmitted signal is being received. After the trailing edge of that signal has passed, the count is transferred to a memory register 21, and counter 19 is reset to zero. These transfer and reset actions are initiated by latch and reset pulses produced, respectively, by gated one-shot 11 and a second pulse generator 22. Ultimately, the count stored in register 21 is converted to an analog electrical current which is utilized to control a readout positioner, as fully explained in the co-pending application of Pasco A. Coia, Ser. No. 199,178, filed Nov. 16, 1971.

The gated one-shot 11 includes a pair of input connections 23 and 24, an output connection 25 which supplies latch pulses to register 21 and reset pulse generator 22, and two NOR gates 26 and 27. The A input of gate 26 is coupled to connection 23 via a differentiating network composed of resistor 28 and capacitor 29, and the B input of this gate is coupled to the output 31 of gate 27 via a second differentiating network consisting of resistor 32 and capacitor 33. The A and B inputs of gate 27, on the other hand, are coupled directly to the output 34 of gate 26 and the input connection 24, respectively, and the gate output 31 is joined directly to one-shot output connection 25. Resistors 28 and 32 are so sized that both inputs of gate 26 are biased to the 0 level; therefore, the output of gate 26 normally is at the 1 level and switches to the 0 level only when a positive-going voltage transition occurs at input connection 23. In contrast, the output 31 of gate 27 normally is at the 0 level and switches to the 1 level only if input connection 24 is at the 0 level at the instant the output of gate 26 switches to that level. As in the case of a conventional one-shot multivibrator, output 31 remains at the 1 level for a period dependent upon the time constant of network 32, 33.

The input connection 23 of gated one-shot 11 is connected to receive the output of a conventional one-shot multivibrator 35 which is triggered by positive-going voltage excursions at relay output connection 15. This one-shot comprises a pair of NOR gates 36 and 37, and two differentiating networks 38, 39 and 41, 42. As explained in the aforementioned Turtle application, one-shot 35 produces output pulses whose width is longer than the transient bounce periods adjacent the leading and trailing edges of the signal at connection 15. The other input 24 of gated one-shot 11 is supplied by a NOR gate 43, both of whose inputs are coupled to relay output connection 15. This gate acts as an inverter and supplies input 24 with the 0 level gating voltage only during the intervals between transmitted signals (i.e., only when relay 13 is deenergized, and the voltage at connection 15 is at the 1 level).

Figure 2:
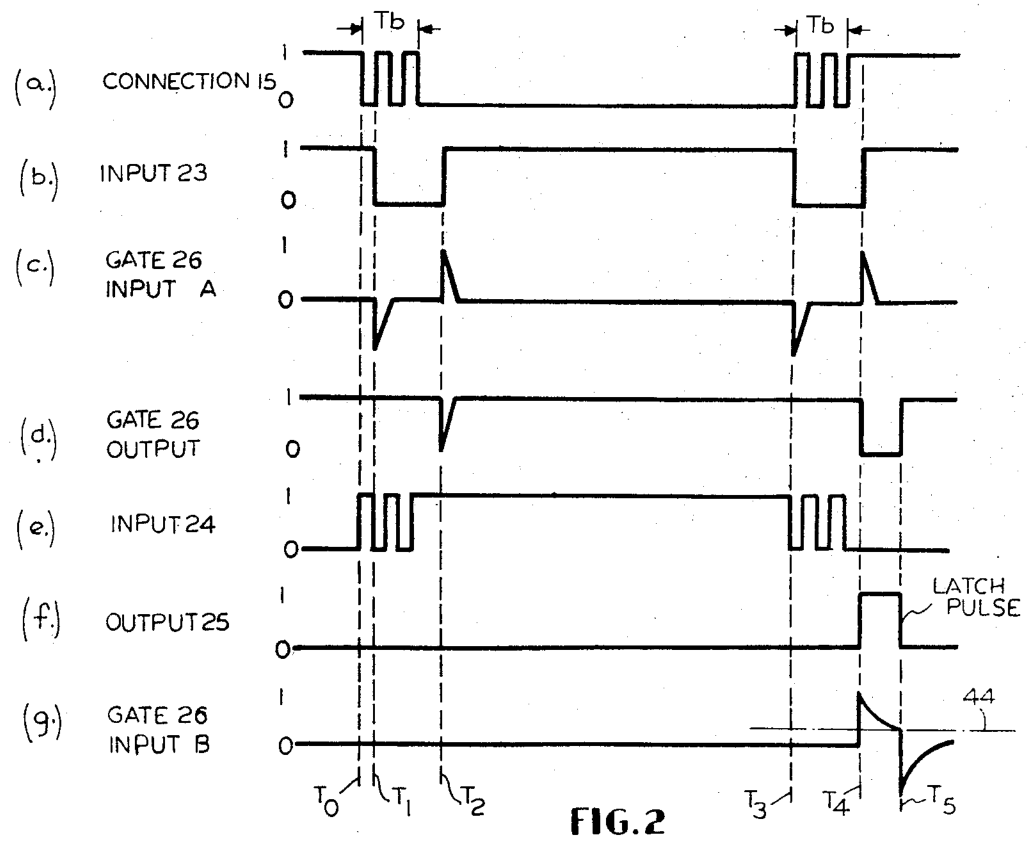
FIG. 2 is a graph showing the wave forms at various points in the apparatus of FIG. 1.

The operation of the FIG. 1 apparatus will now be described using the wave forms depicted in FIG. 2. When the leading edge of the telemetered signal is received at time $T_0$, relay 13 is energized to close contact 17 and thereby cause the voltage at connection 15 to drop from the 1 to the 0 level (see wave form *a*). Because of contact bounce at the transmitter or at relay 13, or at both locations, the leading edge of the time duration signal is followed immediately by a short transient period $T_b$ in which the voltage at connection 15 oscillates back and forth between the 0 and 1 levels. The first positive excursion of the voltage occurs at time $T_1$, and this change causes one-shot multivibrator 35 to deliver an output pulse to the input connection 23 of gated one-shot 11 (see wave form *b*). The duration of this pulse is longer than the bounce period $T_b$, so only one such pulse can be developed at the beginning of the transmitted signal. The leading edge of the pulse subjects the A input of gate 26 to a negative-going voltage spike (wave form *c*), but, since this input is biased to the 0 level, the spike does not produce a change in the output of the gate (see wave form *d*). The trailing edge of the pulse applied to input 23 subjects gate input A to a positive-going spike, and this voltage change does cause the output of gate 26 to drop to the 0 level. However, since at this time, i.e., time $T_2$, the input 24 of gated one-shot 11 is at the 1 level (see wave form *e*), the change in the output of gate 26 does not produce a change in the output of gate 27. Accordingly, the output voltage at connection 25 (see wave form *f*) remains at the 0 level, and the output voltage of gate 26 reverts to the 1 level as soon as the voltage at its A input returns to the 0 level.

When the trailing edge of the telemetered signal is received (i.e., time $T_3$), relay 13 is de-energized, and contact 17 opens. Now, the voltage at connection 15 reverts to the 1 level. As before, steady state conditions are established only after a transient bounce period $T_b$ in which the voltage at connection 15 fluctuates between the 1 and 0 levels. The positive-going voltage excursion which occurs at time $T_3$ causes multivibrator 35 to again deliver to the input 23 of gated one-shot 11 a pulse whose duration exceeds the bounce period. As before, the leading edge of this pulse has no effect upon the output of gate 26, whereas the trailing edge causes gate output to decrease to the 0 level. However, since the trailing edge of the pulse at input 23 now occurs at a time $T_4$ when the voltage at input 24 (wave form *e*) is at the 0 level, the change in the output of gate 26 causes the output of gate 27 (see wave form *f*) and the voltage at the B input of gate 26 to rise from the 0 to the 1 level. The voltage at the B input of gate 26 (see wave form *g*) will remain above the 0-to-1 transition level 44 (i.e., will remain at a 1 level) for a period $T_5$-$T_4$ determined by the RC time constant of elements 32 and 33. Therefore, the gates 26 and 27 produce output pulses of the same width. The output pulse developed by gate 27 is the latch pulse, and it effects transfer of the count from counter 19 to register and also triggers generator 22 to produce the pulse needed to reset the counter. The disclosed circuit inherently provides a time delay between the end of the bounce period $T_b$ and the leading edge of the latch pulse, so the count necessarily will be complete before it is transferred.

It should be noted that the particular gated one-shot 11 employed in the receiver 12 of FIG. 1 represents only one of several forms of the special gated one-shot encompassed by the invention. Three specific alternatives are depicted in FIGS. 3, 5 and 7. The alternative 11a shown in FIG. 3 is the same as its FIG. 1 counterpart, except that the output 31a of gate 27a is coupled directly to the B input of gate 26a, and the differentiator 32a, 33a which determines the width of the output pulse is interposed in the coupling between the output 34a of gate 26a and the A input of gate 27a. Although in this case resistor 32a biases a gate input to the 1 level, and the differentiator 32a, 33a acts to hold that gate input below the 0-to-1 transition level 44a (i.e., at a 0 level) for a prescribed period of time, it will be evident from an inspection of the wave forms of FIG. 4 that this version of the invention also produces a positive output pulse conditional upon simultaneous receipt of a positive-going trigger pulse at input 23a and a 0 level gating voltage at input 24a. Thus, as far as overall results are concerned, this version is the same as the one of FIG. 1.

In the embodiments 11b and 11c of FIGS. 5 and 7, respectively, the gated one-shot function is implemented using a pair of NAND gates, and each device serves to produce a negative-going output pulse conditioned upon simultaneous receipt of a negative-going trigger pulse at input 23b or 23c and a 1 level gating voltage at input 24b or 24c. These versions of the gated one-shot differ structurally from each other in the same ways as the embodiments of FIGS. 1 and 3, but it might be noted that the resistors 32b and 32c bias their associated inputs to the 0 and 1 levels, respectively, whereas the counterparts 32a and 32 in FIGS. 3 and 1, respectively, bias the associated gate inputs to the complements of these levels. From this, it follows that the differentiator 32b, 33b of FIG. 5 acts to hold the associated gate input above the 0-to-1 transition level 44b, rather than below this level as in the FIG. 3 counterpart, and that the corresponding differentiators of FIGS. 1 and 7 also perform opposite voltage-sustaining functions.

The gates described herein are active elements; therefore, charging of the capacitors 33a and 33c in FIGS. 3 and 7 is effected through the internal circuitry of gates 27a and 26c, respectively. Because of this, it should be understood that the resistance component of the RC time constants of networks 32a, 33a and 32c, 33c is composed partly of the associated external resistor 32a or 32c and partly of the internal resistance of the associated gate 27a or 26c.

In conclusion, it should be noted that, while the new gated one-shot affords special advantages when embodied in the noise-masking scheme of FIG. 1, the device may be used in any situation where generation of a pulse of specific width must be dependent upon the simultaneous occurrence of two conditions.

I claim:

1. Apparatus for processing noisy time duration signals which have stable portions represented by a first voltage level and may have transient portions adjacent their leading and trailing edges in which the voltage fluctuates between said first level and a reference level, the apparatus including a. converting means 18, 19, 21 connected to receive said noisy signals and transduce each into digital form, the converting means requiring for each signal a control pulse which is synchronized to the trailing edge of the signal;
b. a one-shot multivibrator 35 which receives said noisy signals and produces an output pulse whose width is greater than said transient portions whenever a signal changes from the first level to the reference level; and
c. a gated one-shot multivibrator e.g., 11 having first and second input connections 23, 24 coupled to receive the output of the multivibrator 35 and said time duration signals, respectively, and serving to produce said control pulse at an output connection 25 only when the trailing edge of said multivibrator output pulse is received at a time when the time duration signal is at its reference level.

2. Apparatus as defined in claim 1 in which the gated one-shot multivibrator e.g., 11 comprises a. two similar NOT-type logic gates 26, 27, each having a pair of inputs A, B and an output 31 or 34;
b. means, including a differentiating network 28, 29, coupling the first input connection 23 to one input A of the first gate 26;
c. means coupling the second input connection 24 to one input B of the second gate 27;
d. means coupling the output 34 of the first gate 26 to the other input A of the second gate 27 and coupling the output 31 of the second gate to both the output connection 25 and the other input B of the first gate 26; and
e. a resistor-capacitor differentiating network 32,33 interposed in the coupling to one of said other inputs and affording an RC time constant which determines the duration of said control pulse.

3. Apparatus as defined in claim 2 in which a. the two gates 26, 27 are NOR gates; and
b. the time duration signals are coupled to the second input connection 24 of the gated one-shot through a NOR gate 43 connected to operate as an inverter with respect to said signals.

4. Apparatus as defined in claim 3 in which a. the first voltage level is more negative than the reference voltage level;
b. the trailing edge of said output pulse of the multivibrator 35 presents a positive-going voltage excursion; and
d. both inputs of the first gate 26 are biased to a 0 logic level.

* * * * *